US010491202B2

(12) United States Patent
Oshida et al.

(10) Patent No.: US 10,491,202 B2
(45) Date of Patent: Nov. 26, 2019

(54) RF GENERATOR

(71) Applicant: HITACHI KOKUSAI ELECTRIC INC., Tokyo (JP)

(72) Inventors: Yoshiyuki Oshida, Tokyo (JP); Kenji Nasu, Tokyo (JP); Naoya Fujimoto, Toyko (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 16/331,383

(22) PCT Filed: Sep. 1, 2017

(86) PCT No.: PCT/JP2017/031597
§ 371 (c)(1),
(2) Date: Mar. 7, 2019

(87) PCT Pub. No.: WO2018/061617
PCT Pub. Date: Apr. 5, 2018

(65) Prior Publication Data
US 2019/0267978 A1 Aug. 29, 2019

(30) Foreign Application Priority Data
Sep. 28, 2016 (JP) .................................. 2016-189689

(51) Int. Cl.
*H05H 1/46* (2006.01)
*H03C 1/00* (2006.01)
(Continued)

(52) U.S. Cl.
CPC ............... *H03K 5/156* (2013.01); *H03K 3/80* (2013.01); *H03K 5/02* (2013.01)

(58) Field of Classification Search
CPC ............ H03K 5/156; H03K 3/80; H03K 5/02; H02M 1/00; H05H 1/46; H01J 37/32174
See application file for complete search history.

(56) References Cited

U.S. PATENT DOCUMENTS

| 8,704,607 B2 * | 4/2014 | Yuzurihara | ....... H01J 37/32082 156/345.28 |
| 9,974,154 B2 * | 5/2018 | Ito | ............................ H05H 1/46 |
| 2016/0174354 A1 | 6/2016 | Ito et al. | |

FOREIGN PATENT DOCUMENTS

| JP | 2011-217482 A1 | 10/2011 |
| JP | 2014-175218 A1 | 9/2014 |

(Continued)

OTHER PUBLICATIONS

International Search Report dated Oct. 3, 2017.

*Primary Examiner* — Kenneth B Wells
(74) *Attorney, Agent, or Firm* — Bacon & Thomas, PLLC (57) ABSTRACT

An RF generator includes: a modulation circuit outputting a pulsed RF signal; a variable attenuation circuit adjusting the level of the pulsed RF signal; an output power detecting unit detecting an output power value of the power output from the device; a first comparative arithmetic circuit outputting a first level control signal for controlling the level of the adjusted pulsed RF signal on the basis of a first detected voltage value and a set voltage value set in advance; a second comparative arithmetic circuit outputting a second level control signal for controlling the level of the adjusted pulsed RF signal on the basis of a second detected voltage value and the set voltage value; and a switching circuit switching between the value of the first level control signal and the value of the second level control signal depending on a switching timing setting value.

4 Claims, 7 Drawing Sheets

(51) Int. Cl.
*H03K 5/156* (2006.01)
*H03K 3/80* (2006.01)
*H03K 5/02* (2006.01)

(56) References Cited

FOREIGN PATENT DOCUMENTS

| | | |
|---|---|---|
| WO | 2007-080696 A1 | 7/2007 |
| WO | 2015-029937 A1 | 3/2015 |
| WO | 2015-056509 A1 | 4/2015 |

\* cited by examiner

RF GENERATOR

FIELD OF THE INVENTION

The present disclosure relates to an RF generator and is applicable to, e.g., a pulse-modulated RF generator.

BACKGROUND OF THE INVENTION

An RF generator is used as industrial equipment for supplying RF energy to a load device for generating plasma, laser or the like and performs surface treatment or processing by using plasma, laser or the like (e.g., Japanese Patent Application Publication No. 2014-175218.)

SUMMARY OF THE INVENTION

In an RF generator, when the load impedance varies, the output level varies due to the variation in the load impedance, which may result in an excessive output. In view of the above, the present disclosure provides an RF generator that reduces the variation in output power.

In accordance with an aspect, there is provided an RF generator comprising: an oscillation circuit configured to output an RF signal having a predetermined frequency; a modulation circuit configured to convert the RF signal outputted from the oscillation circuit to a pulsed RF signal in which an ON state and an OFF state are repeated and output the pulsed RF signal; a variable attenuation circuit configured to adjust and output a level of the pulsed RF signal outputted from the modulation circuit; an amplification circuit configured to amplify and output a power of the pulsed RF signal outputted from the modulation circuit; an output power detecting unit configured to detect an output power value of the pulsed RF power outputted from the amplification circuit; a first comparative arithmetic circuit configured to output a first level control signal for controlling the level of the pulsed RF signal that has been adjusted by the variable attenuation circuit, based on a first voltage value corresponding to a maximum output power value of a leading part of a pulse that is detected by the output power detection unit and a set voltage value that has been previously set as a voltage value corresponding to an output power; a second comparative arithmetic circuit configured to output a second level control signal for controlling the level of the pulsed RF signal that has been adjusted by the variable attenuation circuit, based on a second voltage value corresponding to an output power value of an average level of a trailing part of the pulse that is detected by the output power detection unit and the set voltage value; a switching circuit configured to switch values of the first level control signal and the second level control signal depending on a switching timing setting value; and a time constant circuit configured to set a transition time at the time of updating the first level control signal or the second level control signal to a desired time constant.

EFFECT OF THE INVENTION

In accordance with the RF generator, the variation in output power can be reduced.

BRIEF DESCRIPTION OF THE DRAWINGS

FIG. 3 shows an example of an RF output waveform obtained when an RF generator is connected to a load device such as a laser or the like.

DETAILED DESCRIPTION OF THE EMBODIMENTS

Hereinafter, a comparative example and an embodiment will be described in detail with reference to the accompanying drawings. In the following description, like reference numerals will be given to like or corresponding parts, and redundant description thereof will be omitted.

Comparative Example

Figure 1:
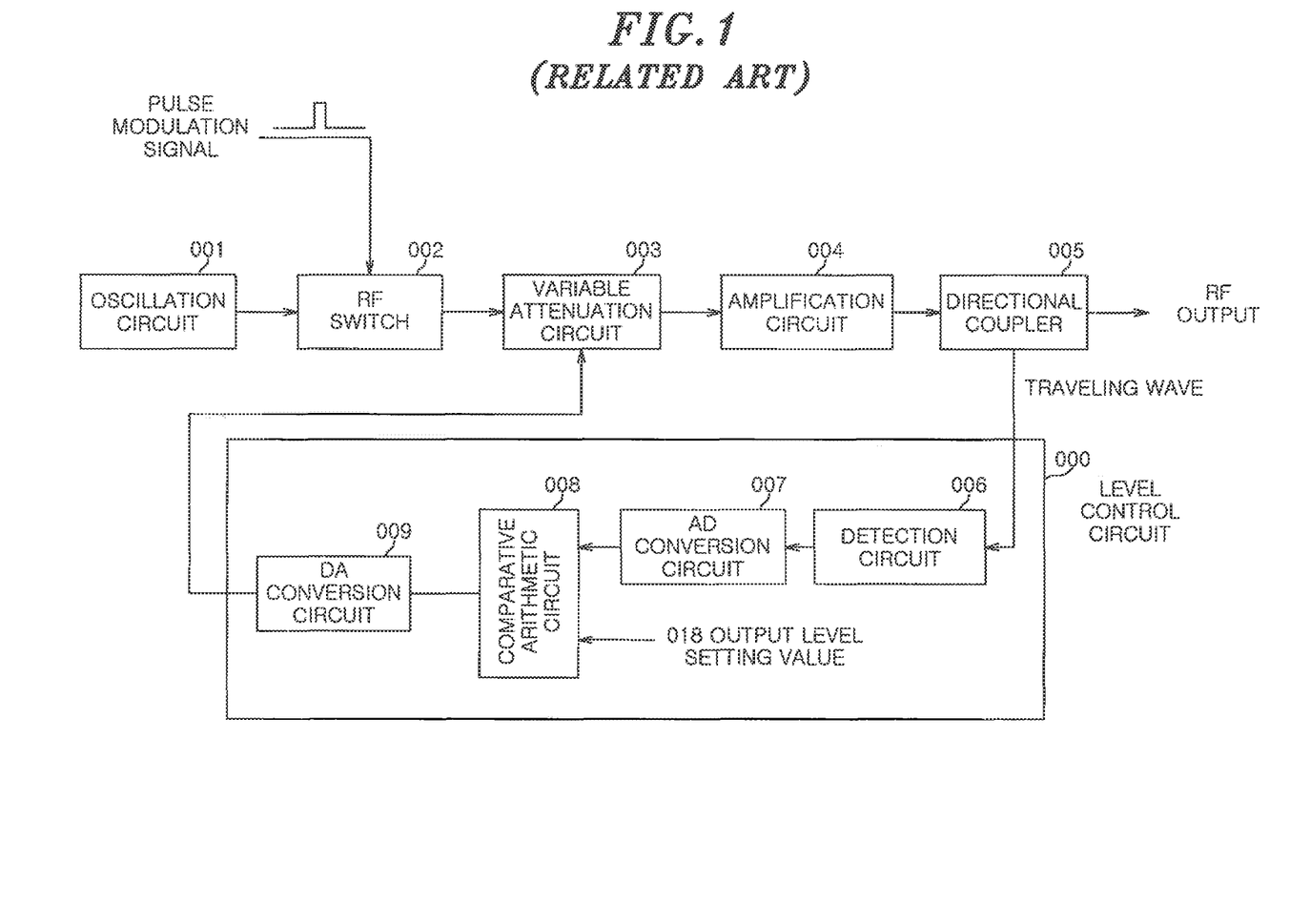
FIG. 1 schematically shows a configuration of a pulse-modulated RF generator according to a comparative example.

A pulse-modulated RF generator related to a technique studied by the present inventors (hereinafter, referred to as "comparative example") will be described with reference to FIG. 1. FIG. 1 schematically shows a configuration of a pulse-modulated RF generator according to the comparative example. The pulse-modulated RF generator according to the comparative example includes an oscillation circuit 001, an RF switch 002, a variable attenuation circuit 003, an amplification circuit 004, a directional coupler 005, and a level control circuit 000. The level control circuit 000 includes a detection circuit 006, an AD conversion circuit 007, a comparative arithmetic circuit 008, and a DA conversion circuit 009.

The oscillation circuit 001 outputs a fixed-level sine wave depending on the root frequency of an output frequency of the RF generator. In other words, the oscillation circuit 001 outputs an RF signal of a predetermined frequency.

The RF switch 002 as a modulator is turned ON/OFF by an external or an internal pulse modulation signal. The RF signal outputted from the oscillation circuit 001 is modulated to a pulsed RF signal in which an ON state and an OFF state are repeated and outputted as a pulsed RF signal by the RF switch 002. In the ON state, the RF signal is outputted. In the OFF state, no RF signal is outputted. In other words, the RF switch 002 outputs the RF signal only during the ON period of the pulsed modulation signal, as shown in FIG. 1.

The variable attenuation circuit 003 as a level adjustment unit varies the output level of the RF generator by adjusting the level (magnitude) of the pulsed RF signal outputted from the RF switch 002. The amount of attenuation is supplied as an analog signal from the level control circuit 000.

The amplification circuit 004 amplifies the power of the pulsed RF signal outputted from the variable attenuation circuit 003 by a predetermined amplification factor (fixed amplification). The amplification circuit 004 amplifies the power of the pulsed RF signal to the device output level of the RF generator. The amplification circuit 004 has no function that can vary the level.

The directional coupler 005 is provided at the output terminal of the RF generator and outputs the pulsed RF power to the load device. Further, the directional coupler 005 attenuates and extracts a forward power and a reflected power (not shown) transmitted through a transmission line and is used for monitoring the output level of the RF power supply. The forward power outputted from the directional coupler 005 is inputted into the detection circuit 006 in the level control circuit 000. After the power of the RF signal is converted to a voltage signal, the forward power is inputted into the AD conversion circuit 007 and converted to digital data. The directional coupler 005, the detection circuit 006 and the AD conversion circuit 007 may be referred to as the "output power detection unit." The configurations of the detection circuit, the AD conversion circuit and the like may vary as long as the output power level of a final stage can be measured.

The comparative arithmetic circuit 008 compares a level of the forward power converted to digital data with an output level setting value 018 (digital value corresponding to 100 W in the case of an RF generator set to 100 W) of the RF generator. The comparative arithmetic circuit 008 has a function of determining and updating a level control value for the next pulse based on the comparison result. When the detected level of the forward power is higher than the output level setting value 018, the level control value is decreased. When the detected level of the forward power is lower than the output level setting value 018, feedback control for increasing the level control value is performed to converge the level of the forward power to a desired setting value.

The level control value for the next pulsed RF signal, which is determined by the comparative arithmetic circuit 008, is converted to an analog voltage by the DA conversion circuit 009. The output control of the RF generator is performed while using the analog voltage as a control input.

The update of the control value for the variable attenuation circuit 003 may be performed multiple times for one pulsed RF signal (one waveform from a high level to a low level of the pulsed RF signal) and fed-back multiple times within the pulsed RF signal. However, in this comparative example, the update of the level control value for one pulsed RF signal is performed once, for convenience of explanation. When the update of the level control value is performed once for one pulsed RF signal, the operation of the comparative arithmetic circuit 008 is performed once for one pulsed RF signal.

Figure 2A:
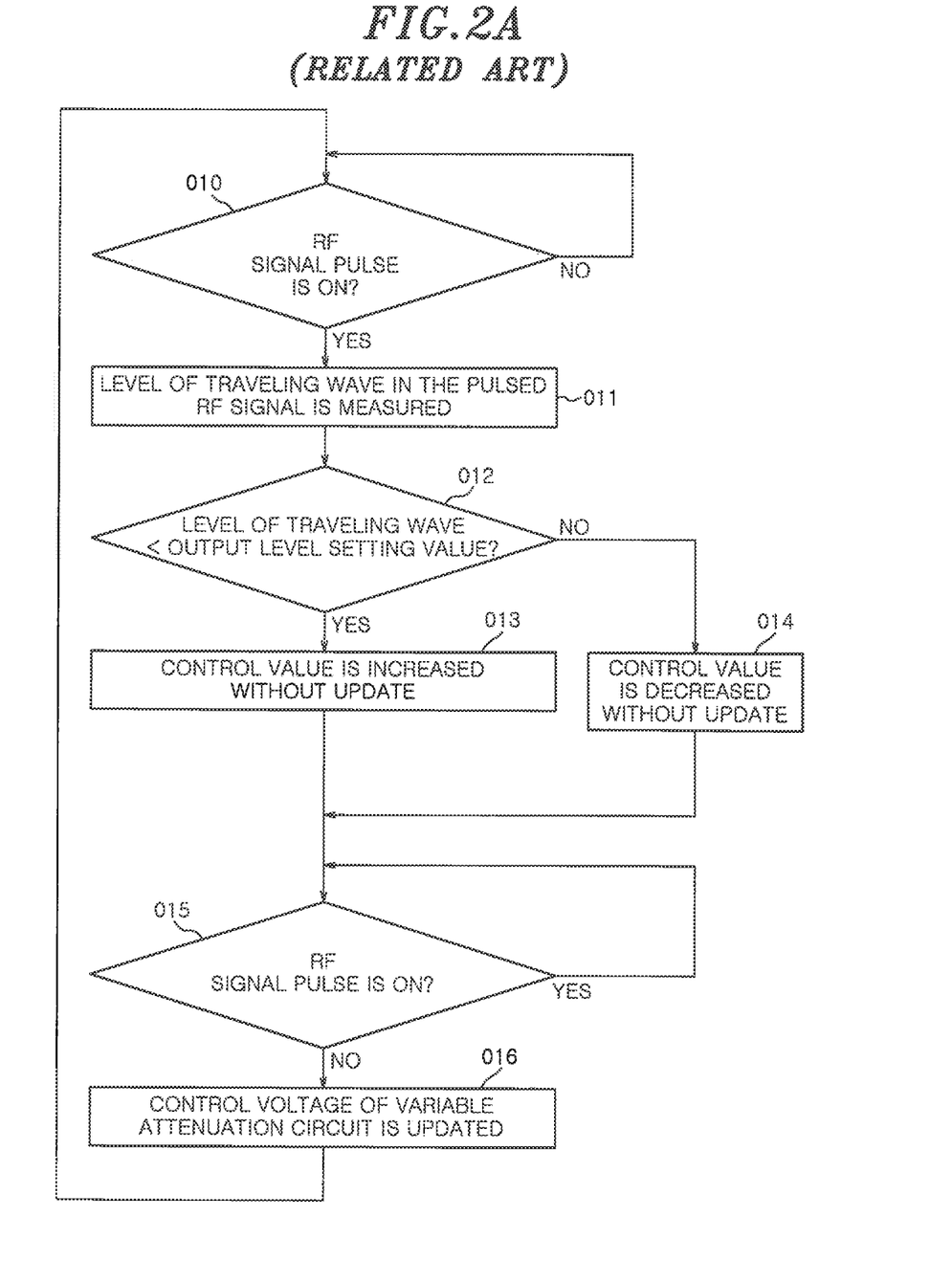
FIG. 2A is a flowchart showing the processing of a comparative arithmetic circuit of FIG. 1.
Figure 2B:
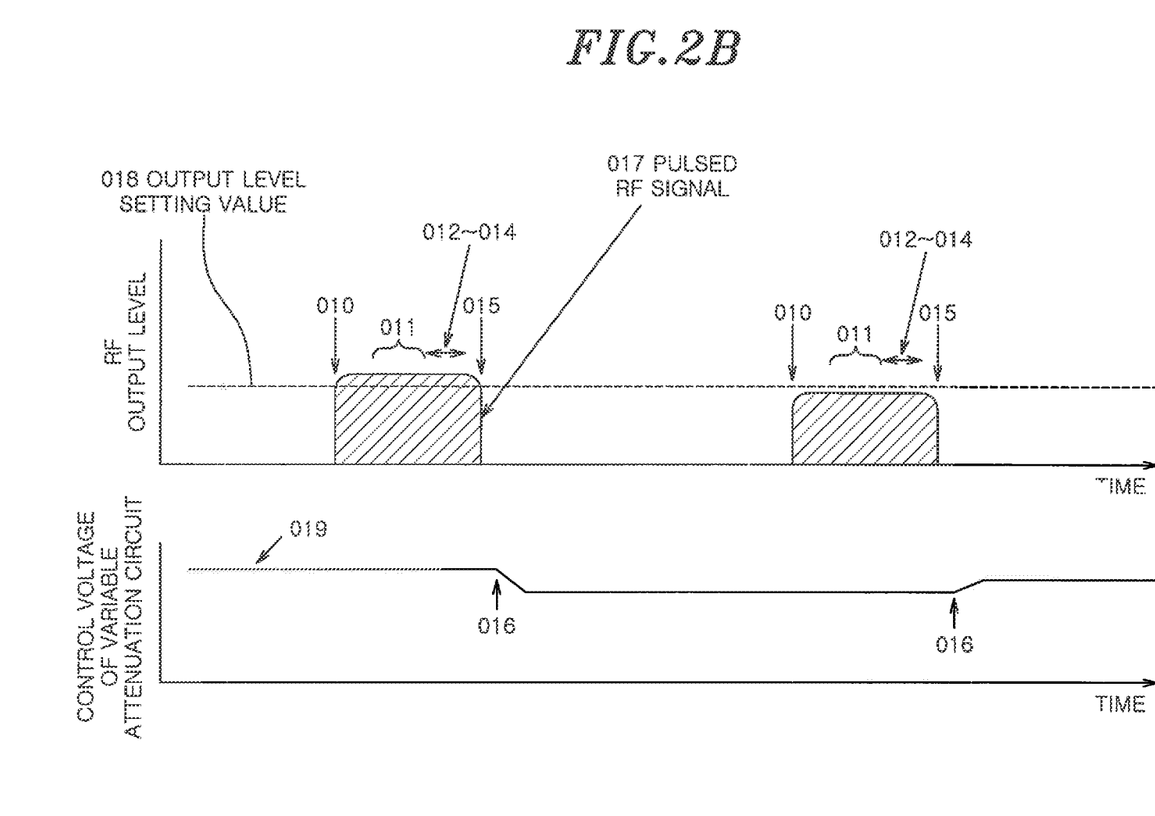
FIG. 2B is a timing chart of an RF output level and a control voltage of a variable attenuation circuit.

Next, the operation of the comparative arithmetic circuit 008 of FIG. 1 will be described with reference to FIGS. 2A and 2B. FIG. 2A is a flowchart of the processing of the comparative arithmetic circuit of FIG. 1. FIG. 2B is a timing chart of an RF output level and a control voltage of the variable attenuation circuit. Reference numerals (step numbers) in the flowchart of FIG. 2A are identical to reference numerals (timing numbers) in the timing chart of FIG. 2B.

When the pulsed modulation signal and the RF signal pulse are turned ON (step 010) and the output of the pulsed RF signal 017 is started, the level of the forward power in a section where the level in the pulsed RF signal 017 is stabilized is measured (step 011). After the level of the forward power is detected, the output level setting value 018 is compared with the detected level of the forward power (step 012). When the level of the forward power is lower, the control value is increased (step 013). When the level of the forward power is higher, the control value is decreased (step 014). Referring to FIGS. 2A and 2B, the level control is performed once for one pulsed RF signal and, thus, the control value is not updated at this timing. After it is checked that the pulse modulation signal and the RF signal pulse are turned OFF (step 015), the analog voltage of the control voltage 019 of the variable attenuation circuit 003 is updated (step 016) and, then, turning ON of a next RF signal pulse is waited. By repeating such a series of operations, the level control is performed once for one pulsed RF signal, and the stabilization of the output is controlled. Referring to FIG. 2B, the level of the forward power of the first pulsed RF signal 017 is higher than the output level setting value 018 and, thus, the control voltage 019 of the variable attenuation circuit 003 is lowered after the RF signal pulse is turned OFF. The level of the forward power of the second pulsed RF signal 017 is lower than the output level setting value 018, the control voltage 019 of the variable attenuation circuit 003 is increased.

Figure 3:
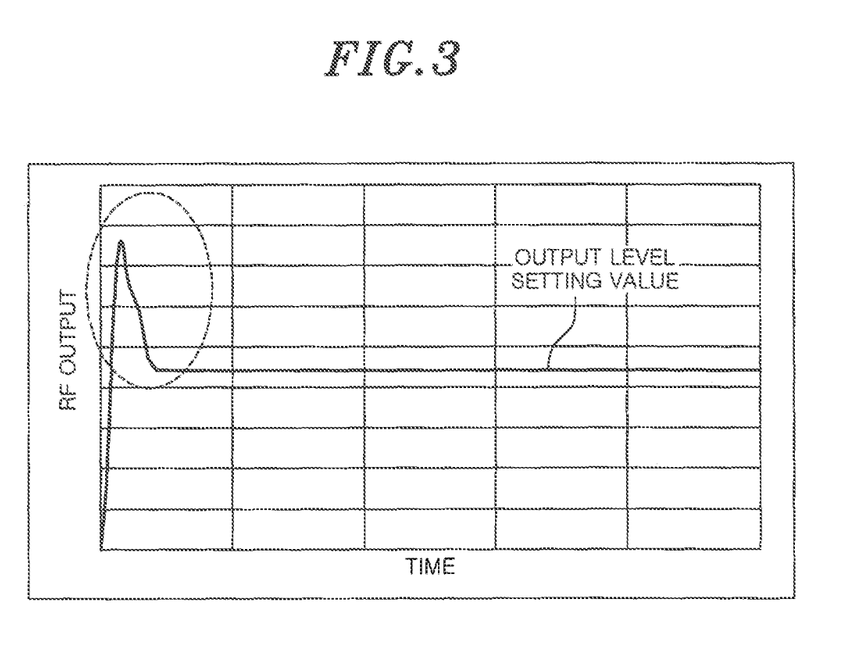

FIG. 3 shows an example of an RF output waveform obtained when the RF generator is connected to the load device such as laser or the like.

FIG. 3 shows the waveform obtained after the detection in the detection circuit 006 in the vicinity of the leading end of the output pulse of the pulsed RF power. The unit of the vertical axis is Watt. A portion surrounded by a dotted line is higher than the output level setting value. This because the load impedance in the vicinity of the leading end of the pulse varies and, thus, the output level varies. When the level control value in one pulsed RF signal is fixed as described above, the output varies due to the variation in the load impedance. Depending on the phase condition of the load impedance, an excessive output may occur as shown in the portion surrounded by the dotted line in FIG. 3. The detection of the level of the forward power in the pulsed RF signal (step 011) described with reference to FIGS. 2A and 2B is carried out when the load impedance is sufficiently stabilized in the waveform of FIG. 3. Therefore, the stabilization control of the output functions in the stable section other than the leading part of the pulse.

(Drawback)

In the RF generator according to the comparative example, the level control value is the same in the pulsed RF signal. Therefore, even at the leading part of the pulse where the load impedance varies, the RF circuit tends to output at the same level in the pulsed RF signal. When the load impedance varies, the output level varies due to the variation in the load impedance, which may result in an excessive output.

The excessive output causes an overvoltage state in the circuits and the components in the RF generator. Depending on the degree of excessive output, a risk for a withstanding voltage of the circuits and the components is increased. In the worst case, breakage of the components or discharge may occur.

If the excessive output continues, overvoltage/overpower stress is continuously applied to the circuits and the components in the RF generator. Thus, the temporal deterioration is accelerated. Accordingly, ignition timing such as laser load or the like varies depending on the degree of excessive output. As the degree of excessive output is increased, the ignition timing tends to be faster. As the degree of the excessive output is decreased, the ignition timing tends to be delayed. When the degree of excessive output varies due to different impedances between devices, the ignition timing may vary for each device.

Embodiment

An RF power supply according to an embodiment employs a method of switching a level control in a pulsed RF signal in two stages. (a) In the first stage, the level control is performed for a section where the load impedance varies in the vicinity of the leading end of the pulse. (b) In the second stage, the level control is performed for a section where the output is stabilized due to the stabilization of the load impedance. The two-stage level control is performed by switching the control voltage of the variable attenuation circuit.

In accordance with the embodiment, it is possible to suppress the excessive output caused by the change in the load impedance (laser or the like), stabilize the output, and suppress temporal deterioration to prevent breakage of the RF power supply.

Figure 4:
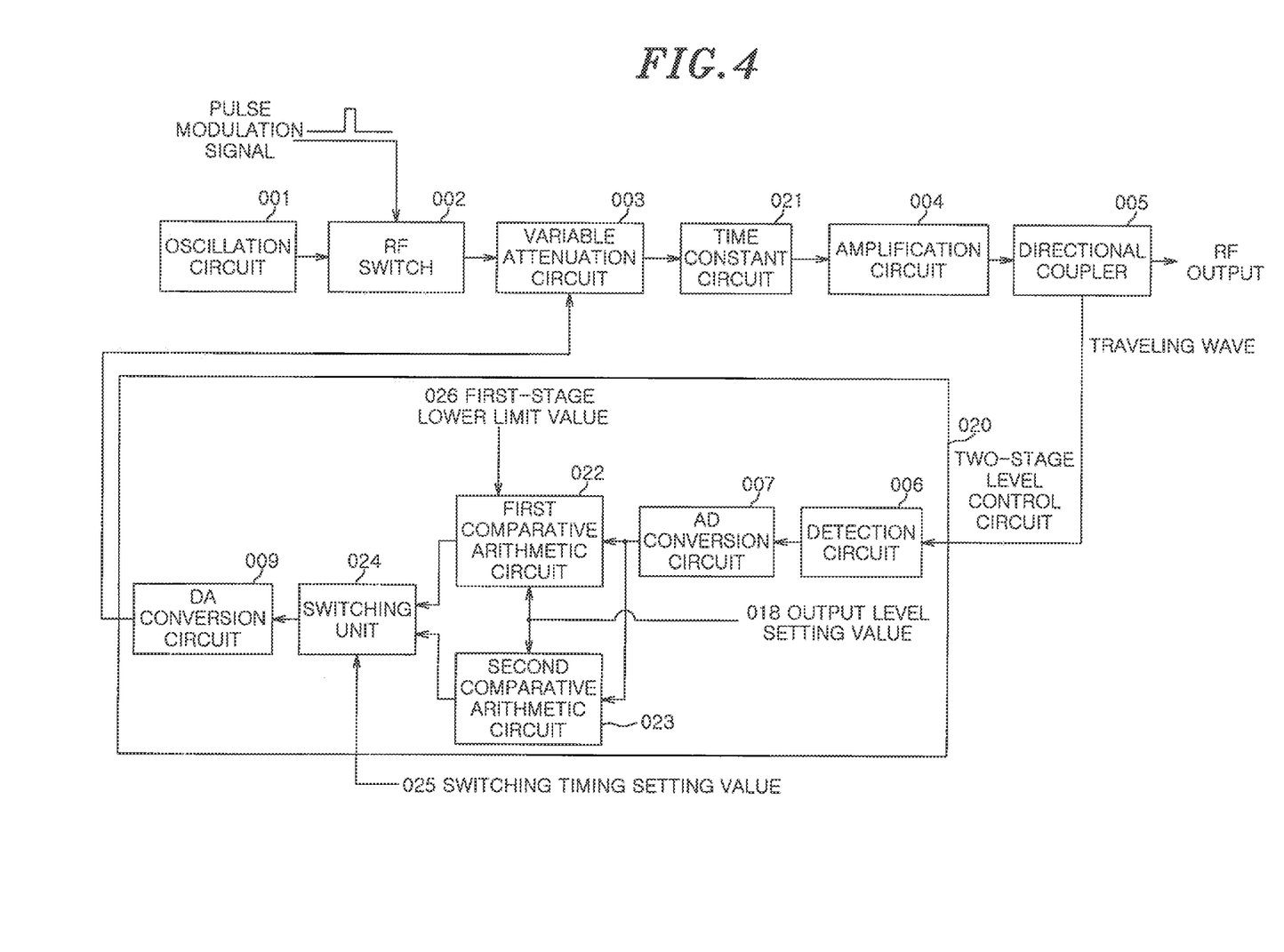
FIG. 4 schematically shows a configuration of a pulse-modulated RF generator according to an embodiment.

The present embodiment will be described with reference to FIG. 4. FIG. 4 schematically shows a configuration of a pulse-modulated RF generator according to the embodiment. The pulse-modulated RF generator according to the embodiment includes an oscillation circuit 001, an RF switch 002, a variable attenuation circuit 003, a time constant circuit 021, an amplification circuit 004, a directional coupler 005, and a two-stage level control circuit 020. The two-stage level control circuit 020 includes a detection circuit 006, an AD conversion circuit 007, a first comparative arithmetic circuit 022, a second comparative arithmetic circuit 023, a switching unit 024, and a DA conversion circuit 009.

The oscillation circuit 001 outputs a fixed-level sine wave depending on a root frequency of an output frequency of the RF generator. In other words, the oscillation circuit 101 outputs an RF signal of a predetermined frequency, e.g., about 30 MHz.

The RF switch 002 as a modulator is turned ON/OFF by an external or an internal pulse modulation signal. The RF signal outputted from the oscillation circuit 001 is modulated to a pulsed RF signal in which an ON state and an OFF state are repeated and outputted as a pulsed RF signal by the RF switch 002. In the ON state, the RF signal is outputted. In the OFF state, no RF signal is outputted. In other words, the RF switch 002 outputs the RF signal only during the ON period of the pulsed modulation signal, as shown in FIG. 4.

The variable attenuation circuit 003 as a level adjustment unit varies an output level of the RF generator by adjusting a level (magnitude) of the pulsed RF signal outputted from the RF switch 002. The amount of attenuation is supplied as an analog signal from the level control circuit 000. The time constant circuit 021 is provided at the rear stage of the variable attenuation circuit 003, and sets a transition time for updating the control voltage of the variable attenuation circuit 003 to a desired time constant. This circuit may be adjusted by using a variable element.

The amplification circuit 004 amplifies a power of the pulsed RF signal outputted from the variable attenuation circuit 003 through the time constant circuit 021 by a predetermined amplification factor (fixed amplification). The amplification circuit 004 amplifies the power of the pulsed RF signal to a device output level of the RF generator. The amplification circuit 004 has no function of varying the level.

The directional coupler 005 is provided at an output terminal of the RF generator and outputs the pulsed RF power to the load device. Further, the directional coupler 005 attenuates and extracts a forward power and a reflected power (not shown) transmitted through a transmission line and is used for monitoring the output level of the RF power supply. The forward power outputted from the directional coupler 005 is inputted into the detection circuit 006 in the two-stage level control circuit 020. After the power of the RF signal is converted to a voltage signal, the forward power is inputted into the AD conversion circuit 007 and converted to digital data. The directional coupler 005, the detection circuit 006, and the AD conversion circuit 007 may be referred to as "output power detection unit." The configurations of the detection circuit, the AD conversion circuit and the like may vary as long as an output power level of the final stage can be measured.

The comparative arithmetic circuit 008 compares a maximum level of the leading part the pulse (until the load impedance becomes stabilized after variation) among the level of the forward power converted to the digital data with an output level setting value 018 (digital value corresponding to 100 W in the case of an RF generator set to 100 W) of the RF generator. The comparative arithmetic circuit 008 has a function of determining and updating a level control value for a next pulse (for the first stage) based on the comparison result. When the detected level of the forward power is higher than the output level setting value 018, the level control value is decreased. When the detected level of the forward power is lower than the output level setting value 018, feedback control for increasing the level control value is performed to converge the level of the forward power to a desired setting value. The first comparative arithmetic circuit 022 has a limitation to prevent the calculation result from becoming execcively low to be smaller than a first-stage lower limit value 026.

The second comparative arithmetic circuit 023 compares an average level of a trailing part (where the load impedance is stabilized around 50Ω) of the pulse among the level of the forward power converted to the digital data with the output level setting value 018 (digital value corresponding to 100 W in the case of an RF power supply set at 100 W) of the RF supply device. The second comparative arithmetic circuit (023) has a function of determining and updating a level control value (for the second stage) for a next pulse based on the comparison result. When the detected level of the forward power is higher than the output level setting value 018, the level control value is lowered. When the detected level of the forward power is lower than the output level setting value 018, feedback control for increasing the level control value is performed to converge the level of the forward power to a desired setting value.

The level control values for the next pulse which are determined by the first comparative arithmetic circuit 022 and the second comparative arithmetic circuit 023 are switched by the switching unit 024 and converted to analog voltages by the DA conversion circuit 009. Then, the output control of the RF generator is performed while using the analog voltages as control inputs of the variable attenuation circuit 003. The switching unit 024 switches the values of the first comparative arithmetic circuit 022 and the second comparative arithmetic circuit 023 depending on a switching timing setting value 025. The first comparative arithmetic circuit 022, the second comparative arithmetic circuit 023 and the switching unit 024 may be implemented as a dedicated hardware, or may be implemented as a CPU and a storage unit that stores an operation program of the CPU.

Figure 5:
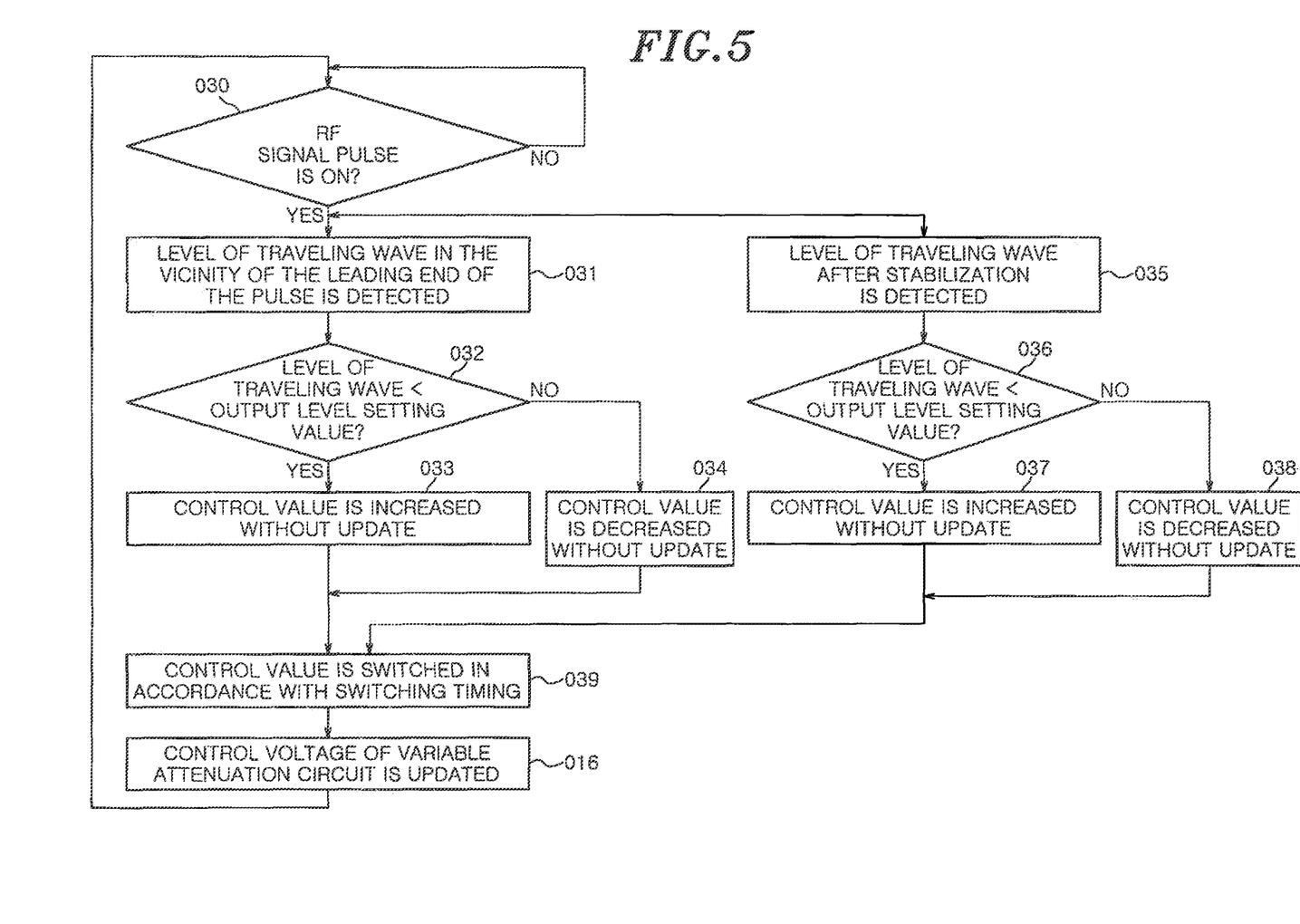
FIG. 5 is a flowchart of a two-stage level control circuit of FIG. 4.

FIG. 5 is a flowchart of the two-level level control circuit 020 of FIG. 4.

When the pulse modulation signal and the RF signal pulse are turned ON (step 030) and the output of the pulsed RF signal is started, the detection of the level of the forward power in the pulsed RF signal is divided into two processes. One is performed to control an output level for the vicinity of the leading end of the pulse by the level detection of the forward power in the vicinity of the leading end of the pulse (step 031). The other is performed to control an output level after the stabilization of the load impedance by the level detection of the forward power after the stabilization (step 035).

After the levels of the forward powers are detected, the detected levels are compared with the output level setting value (steps 032 and 036). Similarly to the comparative example, when the level of the forward power is lower than the output level setting value, the control value is increased (steps 033 and 037). When the level of the forward power is higher than the output level setting value, the control value is decreased (steps 034 and 038).

The determined control value is switched at the rear stage depending on the switching timing setting value 025 (step 039). Specifically, when the RF signal pulse is turned OFF, the control value is switched to a control value in the first stage (for the leading part of the pulse). After the RF signal pulse is turned ON, the control value is switched to control value in the second stage (after the stabilization of the pulse) at the timing in which the load impedance varies becomes stabilized after variation. This operation is performed for each pulse.

The update of the control value for the variable attenuation circuit 003 is performed twice for one pulsed RF signal (one waveform from a high level to a low level of the pulsed RF signal). Therefore, two feedback circuits are provided and switchably driven. The feedback circuits perform control operations independently.

If the level control is performed in two stages, the following two drawbacks may be generated. However, the following drawbacks can be solved in the embodiment.

Figure 6:
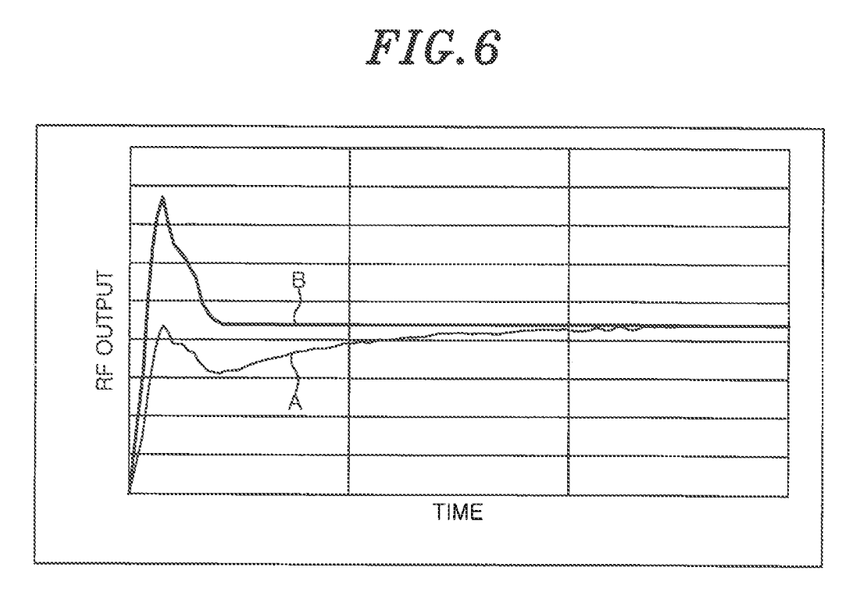
FIG. 6 shows a waveform of an RF output that has a depressed portion.

(1) A waveform has a depressed portion. FIG. 6 shows a waveform of an RF output which has a depressed portion. In FIG. 6, "A" is a waveform obtained when the output of the leading part of the pulse is controlled, and "B" is a waveform in the comparative example. In the case of performing the two-stage control, the level of the leading part of the pulse can be controlled to the same level as that of the stabilized portion. However, as shown in FIG. 6, the waveform has a depressed portion.

However, when the transition waveform at the time of switching the variable attenuation circuit 003 and the transition waveform from an excessive output state to a stable state cancel each other, a waveform has a depressed portion. Accordingly, the RF power to be supplied to the load is stabilized. By adjusting the switching timing and the time constant of the variable attenuation circuit 003, the depressed portion can be suppressed. The switching timing as well as the switching timing setting value 025 in FIG. 4 are used for the switching unit 024 to switch the two control values.

The time constant circuit provided at a rear stage of the variable attenuation circuit 003 may be arranged as in the case of the time constant circuit 021 shown in FIG. 4, and may have a fixed time constant to minimize the operation of the load impedance, or may have a mechanism that can be adjusted by using a variable element.

Figure 7:
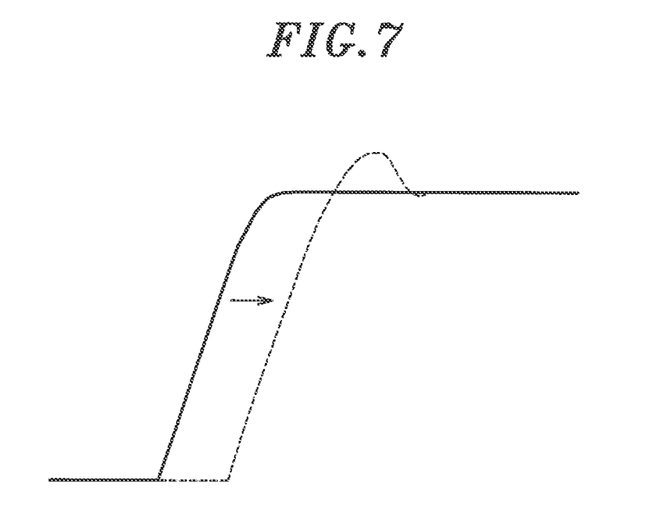
FIG. 7 shows a waveform of an RF output in the case where first-stage level control cannot be performed.

(2) Although the switching timing and the time constant of the variable attenuation circuit are adjusted as described in the drawback (1), delay may occur in an RF output waveform and the first-stage level control may not be performed. FIG. 7 shows a waveform of an RF output in the case where the first-stage level cannot be performed.

As shown in FIG. 7, if the output level control value of the first stage decreases, a waveform indicated by a solid line becomes a waveform indicated by a dotted line due to a rise time. If delay occurs for the control time of the first stage, the variation in the load impedance is delayed as shown in FIG. 7, which may result in an excessive output.

When the level control value of the first stage decreases remarkably, the rise of the pulsed RF signal is delayed and, thus, the section where the load impedance varies is also delayed. The level control value of the first stage has a limit (lower limit value) and the section where the load impedance varies is made to be within the section of the level control of the first stage. This is implemented as the first-stage lower limit value 026 shown in FIG. 4.

(Effect)

With the two-stage level control, the level control can be performed such that the excessive output does not occur in the section where the load impedance in the vicinity of the leading end of the pulse varies. As a result, the overvoltage state does not occur in the circuits and the components in the device can be eliminated, which makes it possible to suppress breakage of the components and occurrence of discharge.

Since the stress of overvoltage/overpower applied to the circuits and the components in the device due to continuous excessive-output are suppressed, temporal deterioration can be suppressed.

Since the output level is stabilized regardless of the degree of variation in the load impedance, it is possible to stabilize the characteristics and the ignition timing of the load such as laser or the like.

By performing two adjustments (switching timing and determination of the lower limit value of the first stage) as the initial adjustment in the case of connecting the RF generator to the load device such as laser or the like, the above-described effects of the present embodiment can be obtained.

While the invention conceived by the present inventors has been specifically described based on the embodiments, the present disclosure is not limited thereto, and can be variously modified.

INDUSTRIAL APPLICABILITY

The present invention can be applied to an RF generator, a semiconductor manufacturing apparatus using the RF generator, or the like. This application claims priority to Japanese Patent Application No. 2016-189689 filed on Sep. 28, 2016, the entire contents of which are incorporated herein by reference.

DESCRIPTION OF REFERENCE NUMERALS

001: oscillation circuit, 002: RF switch, 003: variable attenuation circuit, 004: amplification circuit, 005: directional coupler, 006: detection circuit, 007: AD conversion circuit, 009: DA conversion circuit, 020: two-stage level control circuit, 021: time constant circuit, 022: first comparative arithmetic circuit, 023: second comparative arithmetic circuit, 024: conversion circuit, 025: conversion timing setting value, 026: first-stage lower limit value

What is claimed is:
1. An RF generator comprising:
an oscillation circuit configured to output an RF signal having a predetermined frequency;
a modulation circuit configured to convert the RF signal outputted from the oscillation circuit to a pulsed RF signal in which an ON state and an OFF state are repeated and output the pulsed RF signal;

a variable attenuation circuit configured to adjust and output a level of the pulsed RF signal outputted from the modulation circuit;

an amplification circuit configured to amplify and output a power of the pulsed RF signal outputted from the modulation circuit;

an output power detecting unit configured to detect an output power value of the pulsed RF power outputted from the amplification circuit;

a first comparative arithmetic circuit configured to output a first level control signal for controlling the level of the pulsed RF signal that has been adjusted by the variable attenuation circuit, based on a first voltage value corresponding to a maximum output power value of a leading part of a pulse that is detected by the output power detection unit and a set voltage value that has been previously set as a voltage value corresponding to an output power;

a second comparative arithmetic circuit configured to output a second level control signal for controlling the level of the pulsed RF signal that has been adjusted by the variable attenuation circuit, based on a second voltage value corresponding to an output power value of an average level of a trailing part of the pulse that is detected by the output power detection unit and the set voltage value;

a switching circuit configured to switch values of the first level control signal and the second level control signal depending on a switching timing setting value; and a time constant circuit configured to set a transition time at the time of updating the first level control signal or the second level control signal to a desired time constant.

2. The RF generator of claim 1, wherein the first comparative arithmetic circuit has a limitation to prevent a calculation result from becoming smaller than a lower limit value.

3. The RF generator of claim 2, wherein the first comparative arithmetic circuit decreases the first level control signal when the first voltage value is greater than the set voltage value and increases the first level control signal when the first voltage value is smaller than the set voltage value.

4. The RF generator of claim 2, wherein the second comparative arithmetic circuit decreases the second level control signal when the second voltage value is greater than the set voltage value, and increases the second level control signal when the second voltage value is smaller than the set voltage value.

* * * * *